US005539248A

United States Patent [19]
Abrokwah et al.

[11] Patent Number: 5,539,248
[45] Date of Patent: Jul. 23, 1996

[54] SEMICONDUCTOR DEVICE WITH IMPROVED INSULATING/PASSIVATING LAYER OF INDIUM GALLIUM FLUORIDE (INGAF)

[75] Inventors: Jonathan K. Abrokwah, Tempe; Danny L. Thompson, Mesa, both of Ariz.; Zhiguo Wang, Mountainview, Calif.

[73] Assignee: Motorola, Schaumburg, Ill.

[21] Appl. No.: 555,674

[22] Filed: Nov. 13, 1995

[51] Int. Cl.$^6$ .............................. H01L 29/04; H01L 29/16
[52] U.S. Cl. ........................ 257/631; 257/289; 257/192; 257/632
[58] Field of Search ................................... 257/631, 632, 257/633, 634, 635, 12, 11, 745, 742, 748, 627, 629

[56] References Cited

U.S. PATENT DOCUMENTS 4,368,098  1/1983  Manasevit ................................. 257/11
4,901,326  2/1990  Hayakawa et al. ....................... 257/12
5,051,792  9/1991  Sands ...................................... 257/745

OTHER PUBLICATIONS

Rigout et al. "Chemical and Physical Compatibilities of Fluoride and Fluorophosphate glasses" {In. J. Non–Cryst. Solids (Netherlands). Ninth International Symposium in Non–Oxide Glasses, Hangzhon, China, 24–28 May 1943} J. Non. Cryst. Solids (Netherlands), vol. 184. pp. 319–323 May 1995, 8 REF.

*Primary Examiner*—Robert P. Limanek
*Assistant Examiner*—Alexander Oscar Williams
*Attorney, Agent, or Firm*—Eugene A. Parsons

[57] ABSTRACT

A semiconductor device with an improved insulating and passivating layer including the steps of providing a gallium arsenide substrate with a surface, and crystallographically lattice matching an insulating and passivating layer of indium gallium fluoride on the surface of the gallium arsenide substrate. In one embodiment the semiconductor device is a FET and the layer of indium gallium fluoride covers at least an inter-channel area surrounding the gate.

4 Claims, 2 Drawing Sheets

SEMICONDUCTOR DEVICE WITH IMPROVED INSULATING/PASSIVATING LAYER OF INDIUM GALLIUM FLUORIDE (INGAF)

FIELD OF THE INVENTION

The present invention pertains to the fabrication of semiconductor devices and more specifically to passivation of certain surfaces of the semiconductor devices during the fabrication process.

BACKGROUND OF THE INVENTION

Gallium arsenide (GaAs) devices have an advantage over silicon devices in speed and power consumption. The limiting factor for the extensive use of GaAs lies in the fact that it does not have a passivating layer and, therefore, devices such as GaAs MISFETs can not be satisfactorily produced, which limits the integration levels of GaAs integrated circuits. Compound semiconductor devices, such as FETs, HBTs, lasers, etc., need a properly passivated surface between electrodes for consistent device operation, improved device characteristics, and better reliability.

In GaAs MISFETs, for example, the gate-drain breakdown voltage is one of the most important factors limiting the maximum output power of the MISFET. Many prior methods to increase the breakdown voltage, such as a double gate recess and increased gate-drain spacing, are often accompanied by lower RF gain and/or drain saturation current. Attempts to increase the gate-drain breakdown voltage by placing an insulator between the gate metal and the MISFET channel, such as various nitrides and oxides, usually introduce undesirable interface states.

Recently, GaAs MISFETs with a low interface-state density were realized using a high-resistivity low-temperature-grown GaAs layer as the gate insulator. In a conventional gate MISFET, the high-resistivity low-temperature-grown GaAs layer is deposited and then etched to allow the deposition of source, drain and gate metal contacts. The major problem with this method is that a gap remains between the sides of the metal contacts and the high-resistivity low-temperature-grown GaAs layer, which substantially reduces the breakdown voltage of the MISFET. A typical example of such structures is disclosed in U.S. Pat. No. 5,041,393, entitled "Fabrication of GaAs Integrated Circuits" and issued Aug. 20, 1991.

In an attempt to solve this problem in the prior art, the gate metal was deposited so as to overlap the high-resistivity low-temperature-grown GaAs layer. However, the overlap gate process is difficult and complicated and requires a critical alignment and wet etching process and is not, therefore, easily manufacturable, especially for sub-micron gate dimensions.

Some attempts have been made at fluoridation of GaAs under F2 to produce a $GaF_3$/GaAs interface adjacent the surface of the substrate. The major problem with this procedure is that the $GaF_3$ has a rhombohedral structure with a lattice mismatch of 8.02%. Also, $F_2$ is very corrosive, which causes great reliability problems, and the interfacial region of the semiconductor device includes incompletely fluorinized gallium, arsenide, and free arsenide. Additionally, because of the lattice mismatch, the $GaF_3$ has a relatively high interface state density (poor interface) and a very poor temperature stability, so that subsequent fabrication steps of annealing and the like are very detrimental to the $GaF_3$.

It would be advantageous to have a fabrication method in which interelectrode areas of compound semiconductor devices are passivated so as to provide consistent device operation, improved device characteristics, and better reliability.

It is a purpose of the present invention to provide a new and improved method of fabricating semiconductor devices with a passivated surface area.

It is another purpose of the present invention to provide a new and improved method of fabricating semiconductor devices with a passivated surface area while providing consistent device operation, improved device characteristics, and better reliability.

It is still another purpose of the present invention to provide a new and improved method of fabricating semiconductor devices with a passivated surface area which is relatively easy and accurate to perform.

It is a further purpose of the present invention to provide new and improved semiconductor devices with passivated surface areas which substantially improve breakdown and reliability characteristics of the device.

SUMMARY OF THE INVENTION

The above described problems and others are at least partially solved and the above purposes and others are realized in a method of fabricating a semiconductor device with an improved insulating and passivating layer including the steps of providing a gallium arsenide substrate with a surface, and crystallographically lattice matching an insulating and passivating layer of indium gallium fluoride on the surface of the gallium arsenide substrate.

In one embodiment the semiconductor device is a FET and the layer of indium gallium fluoride covers at least an inter-channel area surrounding the gate.

BRIEF DESCRIPTION OF THE DRAWINGS

Referring to the drawings.

DESCRIPTION OF THE PREFERRED EMBODIMENT

Figure 1:
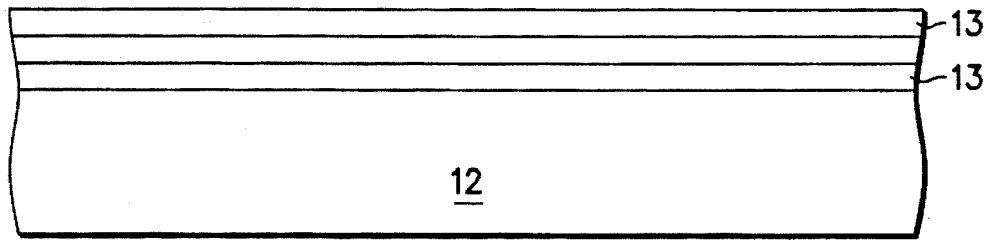
FIGS. 1 through 4 are simplified cross-sectional views illustrating various stages in the fabrication of a semiconductor device with an insulating and passivating layer in accordance with the present invention.

Referring to FIG. 1, a simplified cross-sectional view of a substrate 10 is illustrated. In this embodiment, substrate 10 includes a supporting substrate 12 of gallium arsenide (GaAs) having a plurality of epitaxial layers 13 grown on the surface thereof in any of the techniques utilized in the semiconductor industry. Epitaxial layers 13 are crystalographically lattice matched to supporting substrate 12 in a well known manner and cooperate to provide a device commonly known as a heterostructure field effect transistor (HFET). It will of course be understood by those skilled in the art that an HFET is described herein only for purposes of explanation and various other semiconductor devices could also be fabricated.

Figure 2:
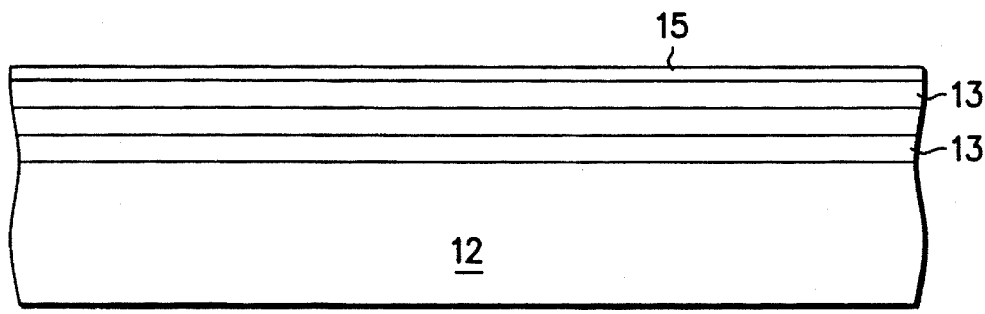

Referring now to FIG. 2, an insulating and passivating layer 15 is positioned on the surface of substrate 10 in overlying relationship to epitaxial layers 13. In a preferred embodiment, layer 15 is a very thin layer of $In_xGa_{x-1}F_3$, where ($0<x<1$). While layer 15 may be grown by any of several methods, in this preferred embodiment it is grown by metalo-organic chemical vapor deposition (MOCVD) or metal-organic molecular beam epitaxy (MOMBE). Generally, substrate 10 is placed in a vacuum chamber and the deposition occurs introducing chemicals to provide the following reaction

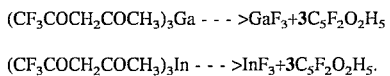

$(CF_3COCH_2COCH_3)_3Ga$ - - - $>GaF_3+3C_5F_2O_2H_5$ $(CF_3COCH_2COCH_3)_3In$ - - - $>InF_3+3C_5F_2O_2H_5$.

The $InF_3$ produced has a rhombohedral structure with a=5.76 angstroms, α=56.4°.

The $GaF_3$ produced has a rhombohedral structure with a=5.2 angstroms, α=57.5°.

Also, $GaF_3$ has a lattice mismatch of 8.02% with GaAs while $InF_3$ has a lattice mismatch of 1.89% with GaAs. Thus, by adjusting x in the ratio $In_xGa_{x-1}F_3$ (i.e. mixing, $GaF_3$ $InF_3$ with a predetermined ratio) layer 15 is lattice matched to substrate 10, in the direction of the basal plane.

Fluoride usually has a large barrier height: 9.6 eV for $GaF_3$ and 8.15 eV for $InF_3$, and has very high resistivity ($10^{12}$ ohms/cm or above). Fluoride has several other advantages over oxides and nitrides including the fact that fluorine is the most electronegative element and tends to segregate at an interface and tie up dangling bonds at the interface. The correct amount of fluorine at an $Si-SiO_2$ interface, for example, makes the interface more hot-electron resistant. Also, polysilicon oxide leakage current and breakdown strength are improved as fluorine is incorporated into the oxide film. Further, Ga—F, In—F, and As—F are strong bonds which are capable of withstanding short time high temperature annealing (such as that performed after doping implants). Thus, the advantages of using $In_xGa_{x-1}F_3$ are a lower interface state density (i.e. $\leq 10^{11}$ $eV^{-1}$ $cm^{-2}$) and better thermal stability since lattice-matched material makes a better interface with the underlying substrate than lattice-mismatched material.

Figure 3:
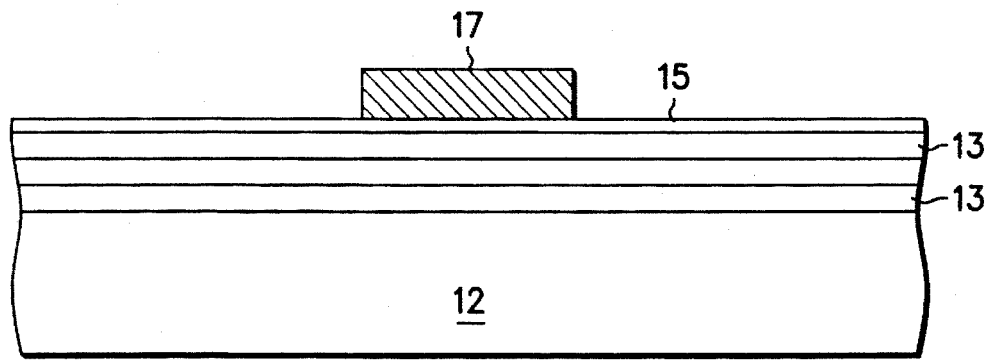
Figure 4:
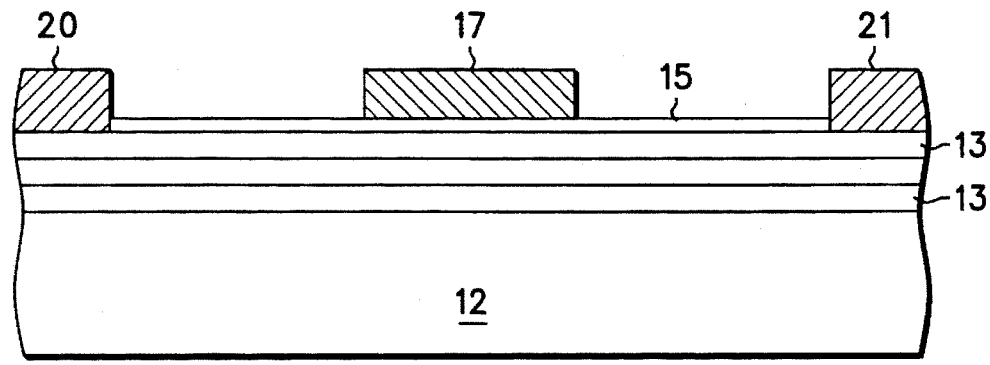

With insulating and passivating layer 15 protecting layers 13, a gate electrode is deposited on the upper surface in overlying relationship to a gate (or channel) area as illustrated in FIG. 3. Other fabrication steps can then be performed, without damaging insulating and passivating layer 15. Typical steps are the deposition of source and drain terminals 20 and 21, respectively. Because of the characteristics of insulating and passivating layer 15, discussed above, a passivated surface area is included which provides consistent device operation, improved device characteristics, and better reliability.

Figure 5:
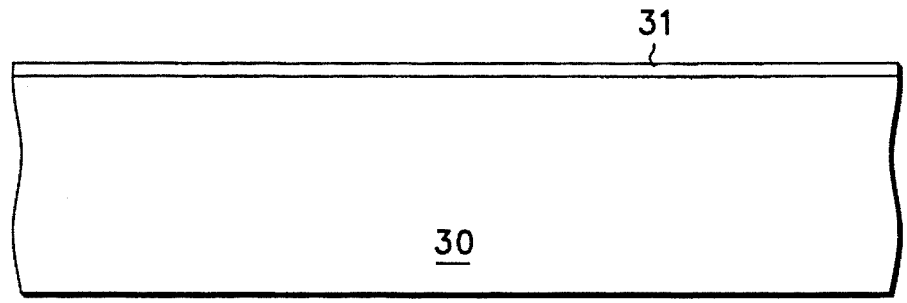
FIGS. 5 through 8 are simplified cross-sectional views illustrating various stages in the fabrication of another semiconductor device with an insulating and passivating layer in accordance with the present invention
Figure 6:
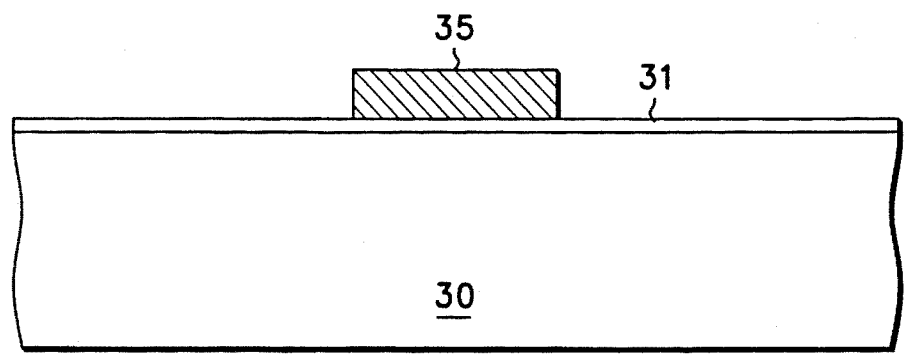
Figure 7:
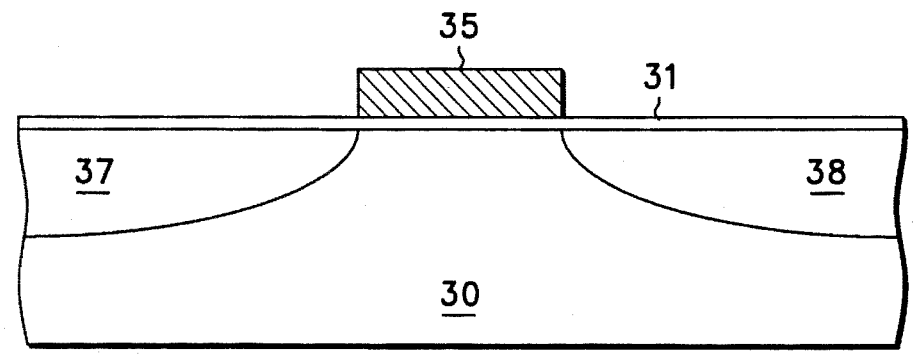

Turning now to FIGS. 5–8, another structure embodying the present invention is illustrated in various simplified cross-sectional views. Referring specifically to FIG. 5, a substrate 30 is provided and an insulating and passivating layer 31 is grown on the upper surface thereof. Layer 31 is basically the same as layer 15 of FIG. 2 but may include a slightly different value of x, i.e. a different ratio of $GaF_3$ to $InF_3$. A control electrode (e.g. gate, base, etc.) 35 is deposited on the surface of layer 15, as illustrated in FIG. 6, and electrode 35 may then be used as a mask for implanting current carrying electrodes (e.g. source/drain, emitter/collector, etc.) 37 and 38 in substrate 30, as illustrated in FIG. 7.

Figure 8:
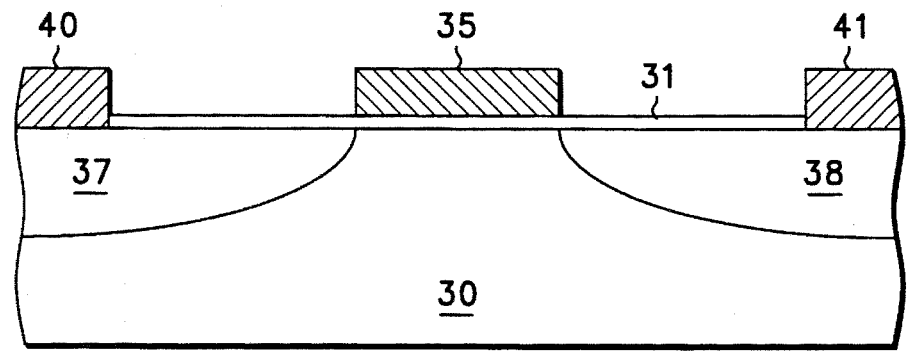

Because layer 31 is heat resistant, electrode 35 can be formed and used as a mask for the subsequent self-aligned procedure, including annealing of electrodes 37 and 38. After the implant and anneal steps, external metal contacts 40 and 41 are deposited on substrate 30 in contact with electrodes 37 and 38, respectively, as illustrated in FIG. 8. In some applications it will be desirable to remove portions of layer 31 where contacts 40 and 41 are placed, but in some applications it may not be necessary to perform this extra step, because of the fact that layer 31 is very thin.

Thus, a new and improved method of fabricating semiconductor devices with a passivated surface area is disclosed. The new and improved method of fabricating semiconductor devices with a passivated surface area provides consistent device operation, improved device characteristics, and better reliability. Also, the new and improved method of fabricating semiconductor devices with a passivated surface area is relatively easy and accurate to perform. Further, new and improved semiconductor devices are disclosed which have substantially improved breakdown and reliability characteristics.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor device with improved insulating and passivating layer comprising:

a gallium arsenide substrate with a surface;

a semiconductor device formed on the surface of the substrate; and an insulating and passivating layer of indium gallium fluoride positioned on at least portions of the semiconductor device and crystallographically lattice matched to the substrate.

2. A semiconductor device with improved insulating and passivating layer as claimed in claim 1 wherein the semiconductor device is a field effect transistor including a gate and surrounding inter-channel area.

3. A semiconductor device with improved insulating and passivating layer as claimed in claim 2 wherein at least the surrounding inter-channel area has the insulating and passivating layer of indium gallium fluoride positioned thereon and crystallographically lattice matched to the substrate.

4. A semiconductor device with improved insulating and passivating layer as claimed in claim 3 wherein the layer of indium gallium fluoride is in the general ratio $In_xGa_{x-1}F_3$, where ($0<x<1$).

* * * * *